(12) United States Patent
Lin

(10) Patent No.: US 8,693,260 B2
(45) Date of Patent: Apr. 8, 2014

(54) MEMORY ARRAY WITH TWO-PHASE BIT LINE PRECHARGE

(75) Inventor: Yung-Feng Lin, Taoyuan (TW)

(73) Assignee: Macronix International Co., Ltd., Hsinchu (TW)

(*) Notice: Subject to any disclaimer, the term of this patent is extended or adjusted under 35 U.S.C. 154(b) by 259 days.

(21) Appl. No.: 13/089,835

(22) Filed: Apr. 19, 2011

(65) Prior Publication Data

US 2012/0269009 A1    Oct. 25, 2012

(51) Int. Cl.
*G11C 11/4063* (2006.01)

(52) U.S. Cl.
USPC ............ 365/185.25; 365/189.15; 365/189.06; 365/203

(58) Field of Classification Search
USPC ................... 365/185.25, 189.15, 189.06, 203
See application file for complete search history.

(56) References Cited

U.S. PATENT DOCUMENTS

| | | | |
|---|---|---|---|
| 6,219,290 B1 | 4/2001 | Chang et al. | |
| 6,392,447 B2 | 5/2002 | Rai et al. | |
| 6,498,751 B2 | 12/2002 | Ordonez et al. | |
| 7,082,061 B2 | 7/2006 | Chou et al. | |
| 7,463,539 B2 | 12/2008 | Lin | |
| 2005/0237810 A1* | 10/2005 | Vali et al. | 365/185.21 |
| 2006/0023539 A1* | 2/2006 | Nakai et al. | 365/206 |
| 2006/0120175 A1* | 6/2006 | Chou et al. | 365/189.06 |
| 2006/0158947 A1* | 7/2006 | Chan et al. | 365/210 |
| 2007/0133271 A1* | 6/2007 | Cho et al. | 365/163 |
| 2011/0090745 A1* | 4/2011 | La Rosa | 365/189.09 |

* cited by examiner

*Primary Examiner* — Douglas King

(74) *Attorney, Agent, or Firm* — Haynes Beffel & Wolfeld LLP

(57) ABSTRACT

An integrated circuit includes an array of memory cells with a plurality of columns and rows. A plurality of data lines is coupled to the columns in the array and a plurality of word lines is coupled to the rows in the array. Clamp transistors are coupled to respective data lines in the plurality of data lines, and adapted to prevent voltage on the respective bit lines from overshooting a target level during a precharge interval. A bias circuit is coupled to the clamp transistors on the plurality of bit lines, and arranged to apply the bias voltage in at least two phases within a precharge interval, and to prevent overshoot of the target level on the bit line.

20 Claims, 4 Drawing Sheets

MEMORY ARRAY WITH TWO-PHASE BIT LINE PRECHARGE

BACKGROUND OF THE INVENTION

1. Field of the Invention

The present invention relates to integrated circuit memory devices, and to sense circuitry in such memory devices.

2. Description of Related Art

Integrated circuit memory devices are becoming smaller and faster. One limitation on the size and speed of memory devices arises from circuitry used for precharging and biasing bit lines in preparation for sensing data from the array. Typical structures used for these purposes are illustrated in U.S. Pat. No. 6,219,290, entitled MEMORY CELL SENSE AMPLIFIER, invented by Chang et al.; U.S. Pat. No. 6,498,751, entitled FAST SENSE AMPLIFIER FOR NONVOLATILE MEMORIES, invented by Ordonez, et al.; and U.S. Pat. No. 6,392,447, entitled SENSE AMPLIFIER WITH IMPROVED SENSITIVITY, invented by Rai et al.

Prior U.S. Pat. No. 7,082,061, entitled MEMORY ARRAY WITH LOW POWER BIT LINE PRECHARGE, invented by Chou et al., is incorporated by reference for a discussion of prior art biasing structures. As explained in U.S. Pat. No. 7,082,061, a basic biasing structure used in prior art memory devices comprises a clamp transistor and a load transistor coupled with each bit line. The clamp transistors can comprise cascode transistors having gates coupled to the output of respective feedback inverters. The inputs to the feedback inverters are coupled to the sources of the clamp transistors and to the data line conductors. A dynamic feedback circuit is thus provided that sets up equilibrium condition, with a small current through the load transistor. The voltage at the sense node settles at the target level, and the bit line is ready for sensing. After the interval allowing the voltage at the sense node to settle at the target level, the memory cell is accessed for sensing by applying a word line potential to the gate of the memory cell. This approach requires feedback inverters for each bit line.

In an alternative embodiment known in the prior art, the dynamic feedback inverters are replaced with a static bias voltage $V_{BIAS}$. The circuit operates in a manner similar to that described above, without the dynamic feedback. As the voltage $V_{BL}$ on the bit line reaches a level that is about a threshold voltage drop across the clamp transistor below the bias voltage $V_{BIAS}$, the clamp transistor begins to turn off and reduce current flow. The dynamic balance is achieved with the voltage at the sense node settling on a target value. At this point, the precharge step is completed, and the bit line is ready for sensing. This can save layout area. However, it relies on the use of an extra bit line and requires extra bias voltages for the bias voltage regulator. Also, in order to implement low power bit line pre-charge, a higher bias level is applied first, followed by a lower bias level when the voltage of the dummy bit line is near the target voltage. However, the higher then lower bias method can only drive a relatively small number of bit lines being coupled to sense amplifiers at the same time, due for example to charge coupling from the data lines to the bias voltage regulator during the precharge operation.

While these prior art techniques have been applied for memory devices successfully, as memory access speeds increase, component sizes decrease, and more complicated and more highly parallel sensing structures are deployed, the requirement of complex biasing structures on every bit line is becoming a limiting factor on size and cost of integrated circuit memories. Also, as power supply voltages drop and operating speeds increase, overshoot during precharge intervals can reduce the margin for sensing data values in the memory arrays. It is therefore desirable to provide sensing systems that occupy less space on an integrated circuit, operate faster and consume less power.

SUMMARY OF THE INVENTION

An integrated circuit device is described including an array of memory cells suitable for high speed, and low voltage operation. Bias circuitry for precharging data lines is described that prevents overshoot, while accomplishing fast precharge intervals. Also, the circuitry described can be implemented with very little layout area on the device.

The memory device in an embodiment described herein includes an array of memory cells with a plurality of columns and rows. A plurality of data lines is coupled to the columns in the array and a plurality of word lines is coupled to the rows in the array. Clamp transistors are coupled to respective data lines in the plurality of bit lines, and adapted to prevent voltage on the respective data lines from overshooting a target level during a precharge interval. A bias circuit is coupled to the clamp transistors on the plurality of bit lines, and arranged to apply the bias voltage in at least two phases within a precharge interval, and to prevent overshoot of the target level on the bit line.

A bias circuit is described that includes a pre-charge transistor, a cascode transistor and a resistive element in series. A feedback circuit is connected to a gate terminal of the cascode transistor from a node on the data line between the cascode transistor and the resistive element. In the bias circuit described herein, the feedback circuit is responsive to a timing signal to set a first bias level during a first phase of a data line precharge interval and the second bias level during a second phase of the data line precharge interval.

In general, a method for sensing data in a memory device is described, where the memory device comprises an array of memory cells including a plurality of columns and rows, a plurality of data lines coupled to columns in the array and a plurality of word lines coupled to rows in the array. Nodes on respective data lines in the plurality of bit lines are clamped near a target level with clamp transistors that are responsive to a bias voltage applied in two or more phases, with a first phase having a lower voltage level than a second phase.

Other aspects and advantages of the present invention can be seen on review of the drawings, the detailed description and the claims, which follow.

DETAILED DESCRIPTION

A detailed description of embodiments of the technology described herein is provided with reference to the FIGS. 1-5.

Figure 1:
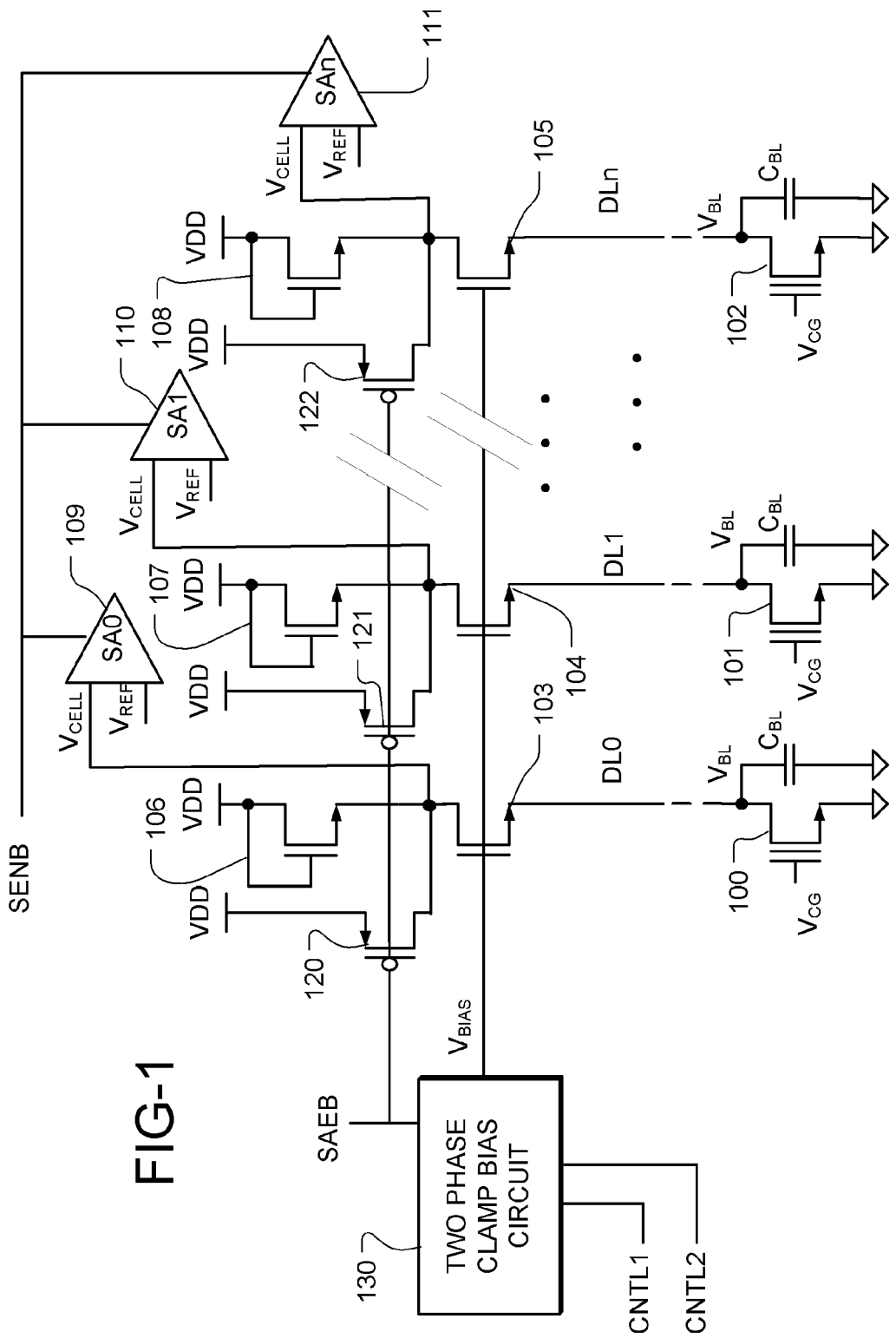
FIG. 1 illustrates a memory circuit including a two-phase bias circuit for clamp transistors on the data lines.

FIG. 1 illustrates a memory circuit including sensing circuitry, precharge circuitry, clamp circuitry and shared biasing circuitry for two-phase, low power precharging. A memory array is represented by memory cells 100-102, found on respective columns along the bit lines in an array of memory cells, wherein the voltages $V_{BL}$ on selected bit lines are coupled to data lines DL0, DL1, . . . DLn by column decoding circuitry (not shown). The data lines DL0, DL1, . . . DLn are coupled at corresponding sense nodes, to sense amplifiers SA0, SA1, . . . SAn through respective data line circuitry that includes, in the illustrated example, a precharge circuit, a load circuit and a clamping circuit as explained in more detail below. Capacitor symbols $C_{BL}$ are illustrated, and associated with each of the bit lines. The capacitor symbols $C_{BL}$ represent the total bit line capacitance for access to a selected cell. In the illustrated embodiment, there are n+1 data lines DL0, DL1, . . . DLn in the array of memory cells. Clamp transistors 103-105 and load transistors 106-108 are included on respective data lines DL0-DLn, and arranged identically in the illustrated embodiment. Clamp transistor 103 acts as a clamping circuit on data line DL0. In this embodiment, the clamp transistor 103 is an n-channel MOS transistor in a cascode configuration with a source coupled to a conductor which is in turn coupled via decoding circuitry to the selected memory cell, with a drain coupled to a sense node $V_{CELL}$, and a gate coupled to a biasing node $V_{BIAS}$. Load transistor 106 acts as a load on data line DL0. The load transistor is an n-channel MOS transistor with its drain and gate coupled to the supply potential VDD, and its source coupled to the sense node $V_{CELL}$. Precharge transistors 120-122 are also coupled to respective data lines DL0, DL1, . . . DLn. The precharge transistor 120 is a p-channel MOS transistor with its source coupled to the supply potential VDD, its drain coupled to the sense node $V_{CELL}$, and a gate coupled to a timing signal SAEB, which in some embodiments could also be applied to the sense amplifiers 109-111 as an enable signal. Clamp transistor 104, load transistor 107 and precharge transistor 121 on data line DL1 are arranged in the same way. Likewise, clamp transistor 105, load transistor 108 and precharge transistor 122 on data line DLn are arranged in the same way. As illustrated, the clamp transistors 103-105 have their gates coupled to a common node at the output of a two-phase clamp bias circuit 130, which applies the bias voltage $V_{BIAS}$. Although, in the embodiment illustrated, the clamp bias circuit 130 operates as a two-phase bias, in alternatives, there may be more than two phases.

The sense node $V_{CELL}$ on data line DL0 is coupled to sense amplifier 109. Likewise, the sense node $V_{CELL}$ on data line DL1 is coupled to sense amplifier 110. The sense node $V_{CELL}$ on data line DLn is coupled to sense amplifier 111. Each of the sense amplifiers 109-111 in this example includes a second input coupled to a reference voltage $V_{REF}$. The sense amplifiers 109-111 provide output data which indicates the data stored in the respective selected memory cells 100-102. The reference voltage $V_{REF}$ can be produced using a dummy reference memory cell, or otherwise.

Control signals are used for controlling the timing of a sensing operation which includes a precharge interval and a sensing interval. In FIG. 1, control signals SAEB, CNTL1 and CNTL2 are coupled to the two-phase clamp bias circuit 130 to control the timing of the first and second phases of the precharge interval. Also, the control signals SAEB and SENB are coupled to the precharge transistors 120-122 and the sense amplifiers 109-111, respectively, to control the timing of application of a precharge voltage to the data lines, and the timing at which the sense amplifiers sense the data on the sense nodes. Typically, the control signal SAEB is applied first to precharge the sense nodes on the data lines, while the two-phase clamp bias circuit 130 produces the bias voltage VBIAS to prevent the sense nodes from overshooting a target level. At the end of the precharge interval, SAEB is used to turn off the precharge transistors 120-122, and the control signal SENB is asserted with appropriate timing so that the voltage $V_{CELL}$ on the sense nodes reflects the data value in the selected memory cells.

The voltage $V_{BIAS}$ is applied to the gates of the clamp transistors 103-105 on all of the data lines DL0-DLn in the array, in two phases that are controlled by the control signals SAEB, CNTL1 and CNTL1, in this example. Of course other combinations of control signals, including the same number of control signals or a different number of control signals, can be used.

The target voltage on the sense nodes has a value determined by the voltage $V_{BIAS}$ at or near the end of the precharge interval, and the gate to source voltage, drop on the clamp transistors 103-105 as they are biased in a cascode configuration. As described herein, the voltage $V_{BIAS}$ is applied in at least two phases, where during the first phase the voltage $V_{BIAS}$ has a first voltage level, and during a second phase the voltage $V_{BIAS}$ has a second voltage level, which is higher than the first voltage level. That is, $V_{BIAS}$ transitions from a lower level to a higher level during the precharge interval for the data line. The lengths of these intervals will be adjusted to match the operation of the memory array and sense amplifiers in a particular implementation. However, the circuitry described herein is adapted for low-voltage, and high-speed memory.

The precharge interval in the array is completed at or near the end of the second phase of the precharge interval, and the data lines DL0-DLn in the array are ready for sensing. Upon accessing a memory cell, in a typical non-volatile memory cell structure, such as a flash memory cell for example, the cell data influences the voltage at the sense node $V_{CELL}$, causing it to move quickly toward a high cell threshold value $V_{CELL\_HVT}$ or toward a low cell threshold value $V_{CELL\_LVT}$. The reference voltage $V_{REF}$ applied to the sense amplifiers 109, 110, 111 is set at a value about halfway between $V_{CELL\_HVT}$ and $V_{CELL\_LVT}$. The margin between the target value on $V_{CELL}$ and $V_{REF}$ at the sense amplifiers 109, 110, 111 is large enough to cover noise effects, but as small as possible for quick sensing.

Figure 2:
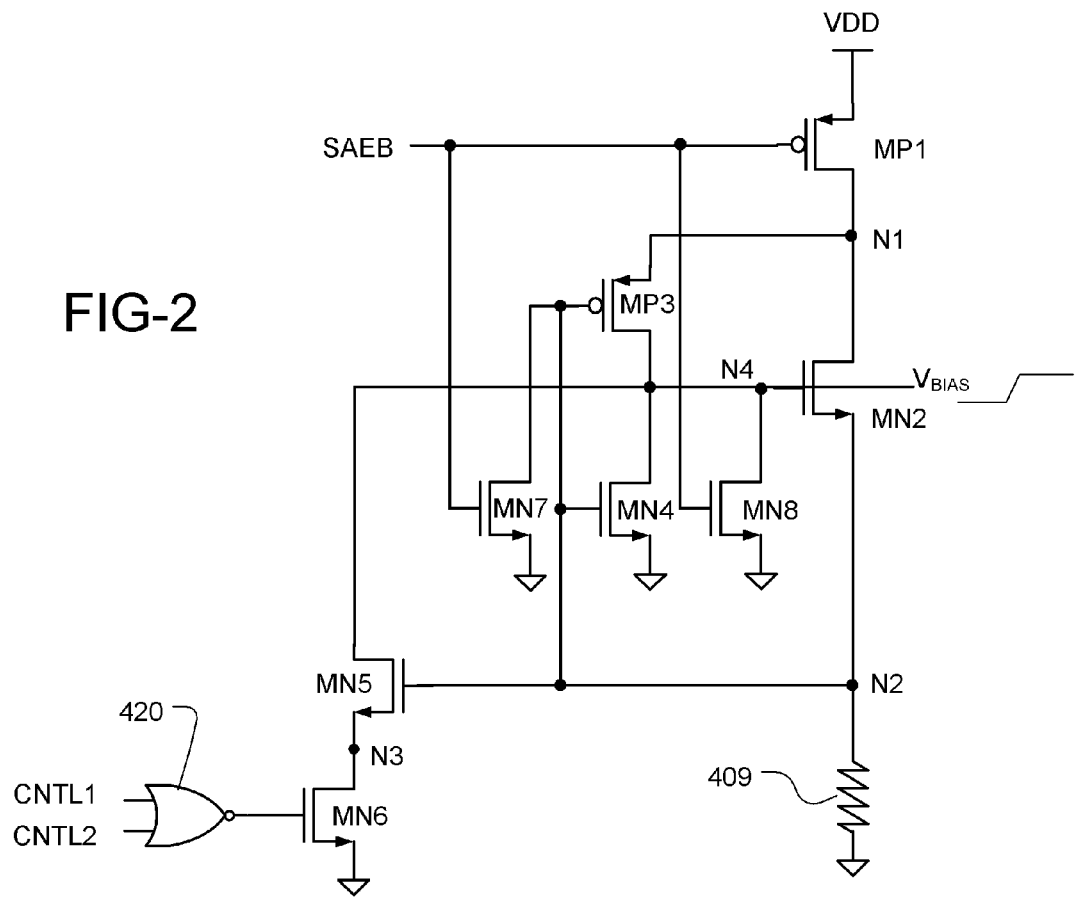
FIG. 2 is a schematic diagram of a two-phase bias circuit for a cascode-based clamping configuration.

FIG. 2 is a schematic diagram of a two-phase bias circuit suitable for use in the circuitry shown in FIG. 1, where the bias voltage transitions from a lower level to a higher level during the data line precharge interval. In an alternative embodiment, this circuit can be arrange to produce a bias voltage that transitions from a higher level to a lower level during a data line precharge interval, by altering the timing control signals for example. The bias circuit in FIG. 2 requires very little layout area on the integrated circuit, and operates efficiently to prevent overshoot on the sense nodes in the memory array configured as shown in FIG. 1.

The bias circuit of FIG. 2 includes a first transistor MP1 having a first terminal coupled to a power supply node VDD, a second terminal coupled to node N1, and a gate coupled to a control signal which, in this example, is SAEB. A second transistor MN2 has a first terminal coupled to node N1 and a second terminal coupled to node N2. The gate of second transistor MN2 is connected to the output of the bias circuit at node N4. A resistive element 409, preferably a passive resistor component, is connected between node N2 and a reference node to receive a reference voltage such as VSS. The reference node, and other reference nodes, are represented in the figure by the triangle symbol. The resistance of the resistive element 409 is set according to the design parameters of the circuit being implemented, so that the voltage at node N2 falls to the proper operating range for the voltage levels desired for the bias voltage $V_{BIAS}$, and the current through the second transistor MN2 is suitable for drivability of the bias voltage. A third transistor MP3 has a first terminal coupled to the node N1, a second terminal coupled to a reference node and a gate coupled to the node N2. A fourth transistor MN4 has a first terminal coupled to node N4 at the output of the bias circuit, at which the bias voltage $V_{BIAS}$ is produced, a second terminal coupled to a reference node and a gate coupled to the node N2. A fifth transistor has a first terminal coupled to node N4 at the output of the bias circuit, a second terminal coupled to node N3 and a gate coupled to the node N2.

An enable circuit, which in this embodiment is implemented using NOR gate 420 and a sixth transistor MN6, is coupled to the node N3. The enable circuit is arranged to couple the node N3 to a reference node during a first phase of the precharge interval, and to decouple the node N3 from the reference voltage during a second phase of the precharge interval.

The control signal SAEB on the gate of MP1 can also be coupled to the gates of precharge transistors in the memory array to which the bias circuit is coupled, and thereby define the beginning and the end of the precharge interval.

The enable circuit in this example comprises a logic gate having at least one input coupled to at least one timing signal. As mentioned above, the logic gate is a two-input NOR gate 420 having control signals CNTL1 and CNTL2 as inputs. The output of the NOR gate 420 is applied to the gate of the transistor MN6. The transistor MN6 has a first terminal coupled to node N3, a second terminal coupled to a reference node, and its gate coupled to the output of the NOR gate 420. The control signals CNTL1 and CNTL2 in this example determine the timing of the first phase and the second phase of the precharge interval, which is explained below with reference to the timing diagram FIG. 3.

A seventh transistor MN7 has a first terminal coupled to the node N2, a second terminal coupled to a reference node, and a gate coupled to the control signal SAEB. An eighth transistor MN8 has a first terminal coupled to node N4 at the output of the bias circuit, a second terminal coupled to a reference node, and a gate coupled to the control signal SAEB. The seventh transistor MN7 and eighth transistor MN8 are active outside of a precharge interval to prevent the node N2 and the node N4 from floating.

Figure 3:
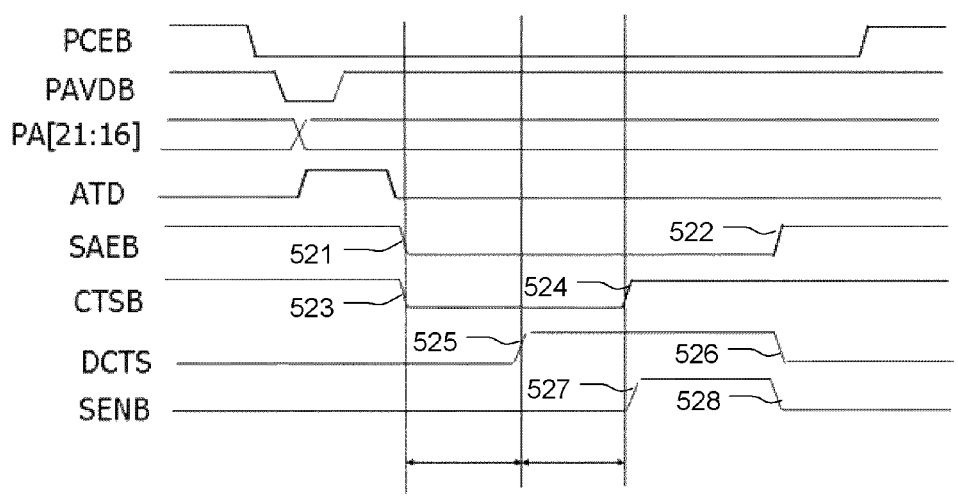
FIG. 3 is a timing diagram for a memory circuit including a bias circuit as shown in FIG. 2.

FIG. 3 is a timing diagram for an embodiment of the bias circuit of FIG. 2 on an integrated circuit including a memory array as shown in FIG. 1. Representative control signals involved in a read operation can include a chip enable signal PCEB, an address valid signal PADVB, address lines PA[21: 16] for example, and an address transition detection signal ATD. Upon initiating a read operation, control signals are applied to control the timing of the sensing operation, including in this example a sense amp enable signal SAEB, a sense signal SENB, and first and second control signals CTSB and DCTS. In this example, first and second control signals CTSB and DCTS correspond to the control signal CNTL1 and CNTL2 of FIG. 2.

As shown in FIG. 3, a sense interval can be defined by an interval that occurs between the transition 527 from low to high in the following transition 528 from high to low in SENB. The precharge interval is defined by time between the transition 523 from high to low and the following transition 524 from low to high in the CTSB signal. The first phase of the precharge interval occurs from the transition 523 in CTSB until the transition 525 from low to high in the control signal DCTS. The second phase of the precharge interval occurs from the transition 525 in the control signal DCTS while the control signal DCTS is high until the transition 524 in CTSB. The SAEB signal is asserted from the transition 521 for the duration of the precharge interval and the sense interval which ends at transition 522 in SAEB, and transition 528 in SENB, in this example. At that time, the control signal DCTS returns to its low state at transition 526.

The circuit of FIG. 2 includes a precharge transistor corresponding with first transistor MP1, a cascode transistor corresponding with second transistor MN2 and a resistive element 409 in series, along with a feedback circuit connected to a gate terminal of the cascode transistor (MN2) from the node N2 between the resistive element and the source of the cascode transistor MN2. The feedback circuit is responsive to the control signals CNTL1 and CNTL2 to set a first bias level during the first phase and a second bias level during the second phase, and wherein the second bias level is higher than the first bias level. The feedback circuit in this example is a two-phase inverter. The input of the inverter is node N2 between the cascode transistor MN2 and the resistive element 409. The output of the inverter provides the output of the bias circuit at node N4. The inverter includes a pull-up transistor MP3, and first and second pulldown transistors (MN4 and MN5) coupled to the input. The sixth transistor MN6 operates as a switch responsive to a control signal at the output of the NOR gate 420 which turns on the second pulldown transistor (MN5) during the first phase of the precharge interval, and turns off the second pulldown transistor (MN5) during the second phase of the precharge interval. As a result, the voltage level at node N4 at the output of the bias circuit is slightly lower during the first phase.

Thus, a method for sensing data in an integrated circuit including memory is described. The method includes applying a precharge voltage during a precharge interval for data lines in the memory array, and clamping sense nodes on respective data lines near a target level using clamp circuits that are responsive to a bias voltage having two or more phases during the precharge interval. The method includes generating the bias voltage in response to timing signals and feedback, so that the bias voltage has a first bias level during the first phase of the precharge interval and a second bias level higher than the first bias level during a second phase of the precharge interval. Then, the sense amplifiers coupled to the sense nodes are enabled during a sensing interval, which begins during or after the second phase of the precharge interval. This method can be implemented using a compact, high speed and low voltage circuit like that shown in FIG. 2. The compact, high-speed and low voltage circuit of FIG. 2, and similar circuits, can be used to drive a large number of clamp transistors for a corresponding large number of data lines in parallel, such as 64, 128 data lines or more, in page mode memory devices. The actual number of data lines driven in parallel will be determined as appropriate for a particular read mode design.

In alternative embodiments, the bias circuit that produces the bias voltage in two or more phases can be implemented using a dynamic feedback based on a comparator like that shown in U.S. Pat. No. 7,082,061, modified so that it applies the first level voltage until the voltage on a reference node reaches a first level and then applies the second level voltage until the voltage on the reference node reaches the target level or the pre-charge interval ends.

In the illustrated example, there are two phases of the precharge interval, and the voltage level of the output of the bias circuit changes rapidly on transition from the first phase to the second phase. In alternative embodiments, there may be more than two phases. Also, the bias levels produced may transition more slowly or more quickly, as suits a particular implementation, so that the first phase and second phase correspond to portions of the pre-charge interval during which the first and second bias levels are reached, rather than intervals defined by sharp transitions in the bias levels.

Figure 4:
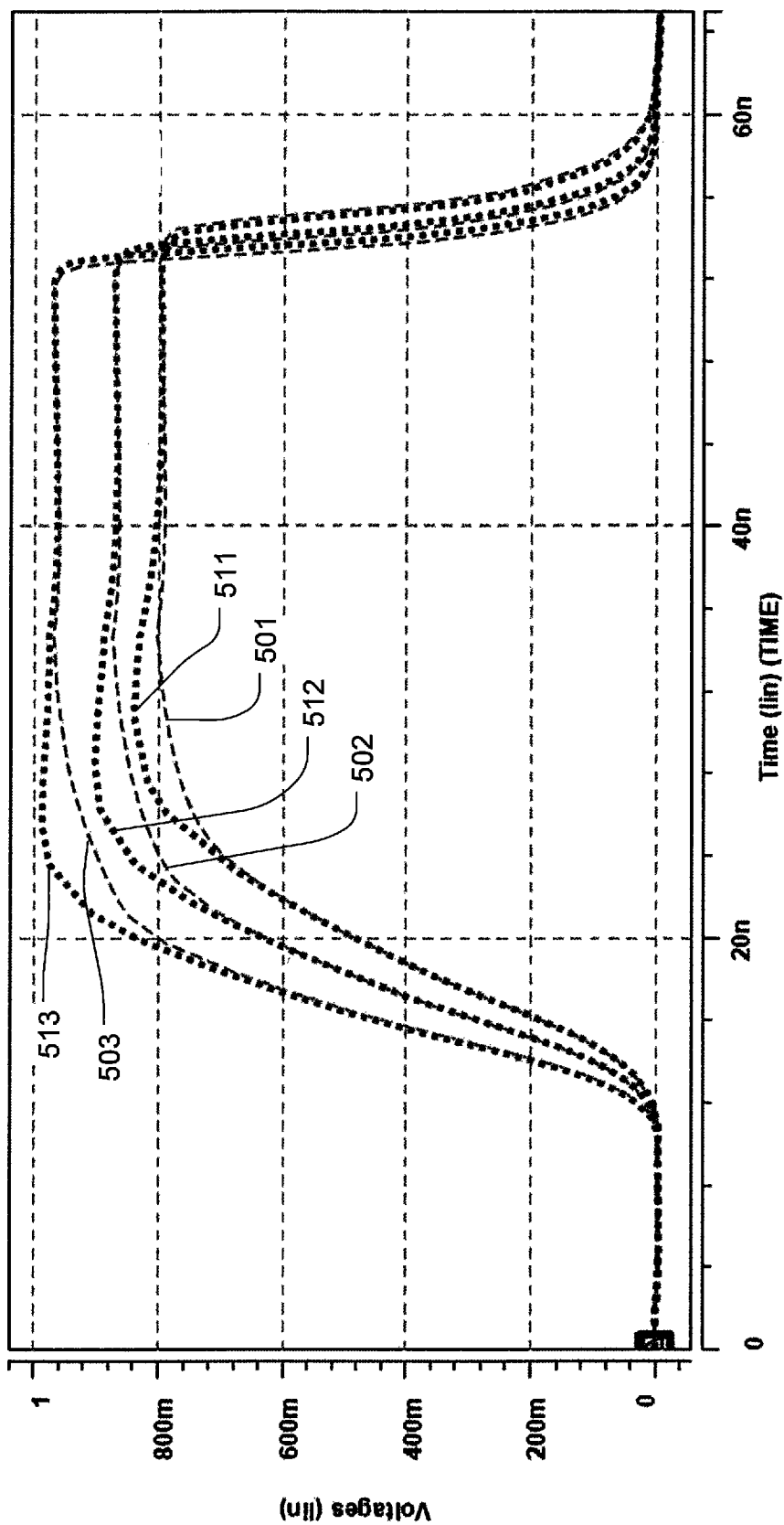
FIG. 4 is a plot comparing simulation of sense node voltage for a memory as described herein with sense node voltage developed using a static bias voltage.

FIG. 4 illustrates the results of simulation of data line voltages during a high-speed read operation using a bias circuit like that shown in FIG. 2, for a target level at the sense node after precharge in the range of about 800 to 950 millivolts, as compared to a traditional scheme using a one level bias voltage for controlling the gate of the cascode transistors on the data lines. Traces 501, 502, 503 illustrate the simulation of the two-phase bias circuit as described herein, demonstrating that the approach described herein prevents overshoot, because the traces show essentially no overshoot on the data lines. In contrast, the traces 511, 512, 513 demonstrate overshoot that occurs using a single level bias approach.

Figure 5:
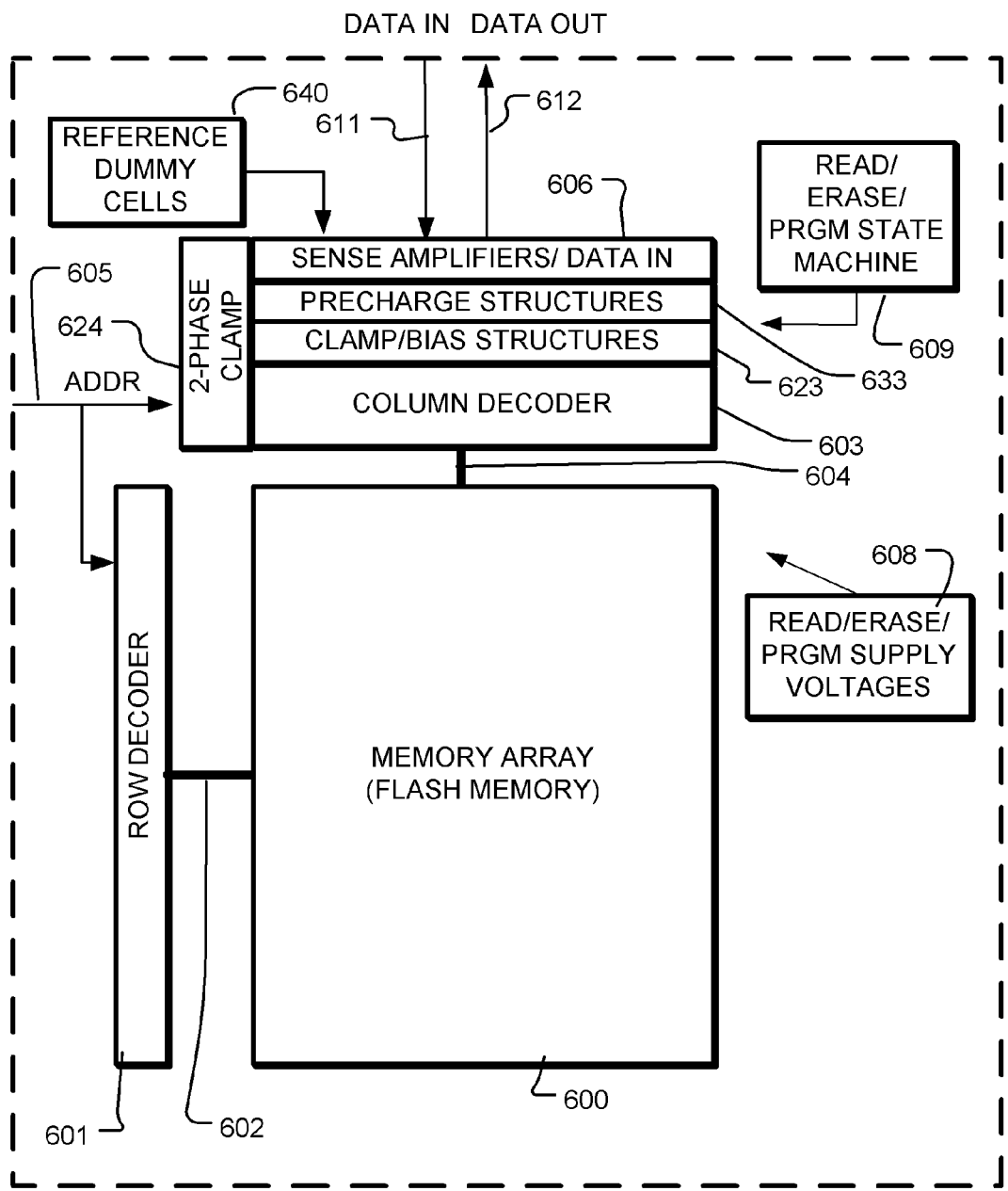
FIG. 5 is a simplified block diagram of an integrated circuit memory device including the technology described herein.

FIG. 5 is a simplified block diagram of an integrated circuit including precharge and clamping circuitry controlled by a reference bit line. The integrated circuit includes a memory array 600 implemented using memory cells, such as floating gate or charge trapping non-volatile memory cells, read only memory cells, or other types of memory cells. In a preferred implementation, the memory array is configured in a NOR architecture. A page/row decoder 601 is coupled to a plurality of word lines 602 arranged along rows in the memory array 600. A column decoder 603 is coupled to a plurality of bit line conductors 604 arranged along columns of memory cells in the memory array 600. Clamping/bias structures 623 are coupled to data lines (not shown) for the columns of memory cells in the memory array, and via the column decoder 603 and bit line conductors 604 in the manner described above, including for example in the manner described with respect to FIG. 1. Also, precharge structures 633 are coupled to the columns of memory cells in the memory array via the column decoder 603 and bit line conductors 604 in the manner described above. A two-phase clamp bias circuit 624 (operating in two or more phases) is coupled to the clamp/bias structures 623 as discussed above, and prevents overshoot on the data lines during precharge for high speed, low voltage memory.

Addresses are supplied on bus 605 to column decoder 603 and page/row decoder 601. Sense amplifiers and data-in structures in block 606 are coupled to the selected memory cells via the column decoder 603, clamp/bias structures 623, and precharge structures 633. A plurality of reference dummy cells 640 is included on the integrated circuit, and used for generating reference voltage which is used by the sense amplifiers in the block 606, so that the reference voltage used by the sense amplifiers in the block 606 track changes in threshold of the actual memory cells in the memory array 600. Data is supplied via the data-in line 611 from input/output ports on the integrated circuit to the data-in structures in block 606. Data is supplied via the data-out line 612 from the sense amplifiers in block 606 to input/output ports on the integrated circuit.

Resources for controlling the reading, programming and erasing of memory cells in the array 600 are included on the chip. These resources include read/erase/program supply voltage sources represented by block 608, and the state machine 609 that produces or controls the timing of control signals, which are coupled to the array 600, the decoders 601, 603 and other circuitry on the integrated circuit, which participates in operation of the device.

The supply voltage sources (block 608) are implemented in various embodiments using charge pumps, voltage regulators, voltage dividers and the like as known in the art, for supplying various voltage levels, including negative voltages, used in the read, erase and program operations.

The state machine 609 supports read, erase and program operations. The state machine 609 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine. Although not illustrated, the integrated circuit shown in FIG. 5 can include other components arranged for example in a system-on-a-chip configuration. Thus, it is representative of an integrated circuit that includes memory, and possibly other mission circuitry.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   an array of memory cells, including a plurality of columns and rows;
   a plurality of data lines coupled to columns in the array;
   a plurality of word lines coupled to rows in the array;
   a precharge circuit to precharge a data line in the plurality of data lines in a precharge interval, having a first phase and a second phase;
   a clamp circuit, coupled to the data line in the plurality of data lines;
   a bias circuit that provides a bias voltage which turns on the clamp circuit with a first bias level during the first phase of the pre-charge interval, and with a second bias level higher than the first bias level during the second phase of the pre-charge interval, the bias circuit being responsive to at least one timing signal to set the first bias level during the first phase and the second bias level during the second phase; and
   a sense amplifier coupled to the data line.

2. The device of claim 1, wherein the clamp circuit prevents voltage at a sensing node on the data line from exceeding a target level.

3. The device of claim 1, wherein the bias circuit includes a pre-charge transistor, a cascode transistor and a resistive element in series, with a feedback circuit connected to a gate terminal of the cascode transistor from a node on a corresponding data line between the cascode transistor and the resistive element, the feedback circuit being responsive to the at least one timing signal.

4. The device of claim 3, wherein the feedback circuit includes a two-phase inverter, having an input coupled to the node between the cascode transistor and the resistive element, and an output producing the bias voltage, the two-phase inverter including a pull-up transistor, and first and second pull-down transistors coupled to the input, and a switch responsive to a control signal which turns on the second pull-down transistor during the first phase, and turns off the second pull-down transistor during the second phase.

5. The device of claim 1, wherein the clamp circuit comprises a cascode transistor having a gate terminal coupled to the bias circuit.

6. The device of claim 1, including a pre-charge circuit and a load circuit coupled to a sensing node on the data line in the plurality of data lines; wherein the clamp circuit includes a transistor in a cascode configuration between the sensing node and the data line.

7. The device of claim 1, wherein the bias circuit includes:
a first transistor having a first terminal coupled to a power supply node, a second terminal coupled to a first node, and a gate coupled to a sense timing signal;
a second transistor having a first terminal coupled to said first node, a second terminal coupled to a second node, and a gate coupled to the output of the bias circuit;
a resistive element connected between said second node and a reference node;
a third transistor having a first terminal coupled to said first node, a second terminal coupled to the output of the bias circuit, and a gate coupled to the second node;
a fourth transistor having a first terminal coupled to the output of the bias circuit, a second terminal coupled to a reference node, and a gate coupled to the second node;
a fifth transistor having a first terminal coupled to the output of the bias circuit, a second terminal coupled to a third node, and a gate coupled to the second node; and
an enable circuit coupled to the third node, arranged to couple the third node to a reference node during a first phase of the precharge interval, and to decouple the third node from the reference node during a second phase of the precharge interval.

8. The device of claim 7, wherein the enable circuit comprises a logic gate having at least one input coupled to the at least one timing signal, and a sixth transistor having a first terminal coupled to said third node, a second terminal coupled to a reference node, and a gate coupled to the logic gate.

9. The device of claim 7, including:
a seventh transistor having a first terminal coupled to the second node, a second terminal coupled to a reference node, and a gate coupled to the sense timing signal; and
an eighth transistor having a first terminal coupled to the output of the bias circuit, a second terminal coupled to a reference node, and a gate coupled to the sense timing signal.

10. The device of claim 7, wherein the first and third transistors are p-channel field effect transistors, and the second, fourth and fifth transistors are n-channel field effect transistors.

11. The device of claim 7, wherein the resistive element comprises a passive resistor.

12. A bias circuit for a data line in a memory device, comprising:
a pre-charge transistor, a cascode transistor and a resistive element in series;
a feedback circuit connected to a gate terminal of the cascode transistor from a node on the data line between the cascode transistor and the resistive element, the feedback circuit being responsive to a timing signal to set a first bias level during a first phase of a data line precharge interval and a second bias level during a second phase of the data line precharge interval.

13. The bias circuit of claim 12, wherein the second bias level is higher than the first bias level.

14. The bias circuit of claim 12, wherein the precharge transistor is a p-channel field effect transistor, and the cascode transistor is a n-channel field effect transistor.

15. The bias circuit of claim 12, wherein the resistive element comprises a passive resistor.

16. The bias circuit of claim 12, wherein the feedback circuit includes a two-phase inverter, having an input coupled to the node between the cascode transistor and the resistive element, and an output producing the bias voltage, the two-phase inverter including a pull-up transistor, and first and second pull-down transistors coupled to the input, and a switch responsive to a control signal which turns on the second pull-down transistor during the first phase, and turns off the second pull-down transistor during the second phase.

17. The bias circuit of claim 16, wherein the precharge transistor is a p-channel field effect transistor, and the cascode transistor and the first and second pull-down transistors are re-channel field effect transistors.

18. A method for sensing data in a memory device, comprising an array of memory cells, including a plurality of columns and rows; a plurality of data lines coupled to columns in the array; and a plurality of word lines coupled to rows in the array; the method comprising:
applying a pre-charge voltage during a pre-charge interval to a data line in the plurality of data lines;
clamping a node on the data line in the plurality of data lines with a clamp circuit coupled to a bias voltage during the pre-charge interval, the bias voltage having a first bias level during a first phase of the pre-charge interval, and having a second bias level higher than the first bias level during a second phase of the pre-charge interval, the first bias level during the first phase and the second bias level during the second phase being set responsive to at least one timing signal; and
enabling a sense amplifier coupled to the node during a sensing interval, wherein the sensing interval begins during or after the second phase.

19. The method of claim 18, including generating the bias voltage in response to timing signals and dynamic feedback.

20. The method of claim 18, including using cascode transistors on the data lines for said clamping.

* * * * *

UNITED STATES PATENT AND TRADEMARK OFFICE
CERTIFICATE OF CORRECTION

PATENT NO. : 8,693,260 B2
APPLICATION NO. : 13/089835
DATED : April 8, 2014
INVENTOR(S) : Yung-Feng Lin It is certified that error appears in the above-identified patent and that said Letters Patent is hereby corrected as shown below:

In the Claims

In claim 17, column 10, line 28, delete "re-channel", and insert -- n-channel --.

Signed and Sealed this
Second Day of September, 2014

Michelle K. Lee
*Deputy Director of the United States Patent and Trademark Office*